(12) United States Patent
Chen et al.

(10) Patent No.: US 11,358,868 B2
(45) Date of Patent: Jun. 14, 2022

(54) DEVICE COMPRISING PHYSICAL PROPERTIES CONTROLLED BY MICROSTRUCTURE AND METHOD OF MANUFACTURING THE SAME

(71) Applicant: NATIONAL CHENG KUNG UNIVERSITY, Tainan (TW)

(72) Inventors: Tse-Ming Chen, Tainan (TW); Sheng-Chin Ho, Tainan (TW); Yu-Chiang Hsieh, Tainan (TW); Ching-Hao Chang, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 307 days.

(21) Appl. No.: 16/718,684

(22) Filed: Dec. 18, 2019

(65) Prior Publication Data

US 2021/0009423 A1 Jan. 14, 2021

(30) Foreign Application Priority Data

Jul. 10, 2019 (TW) .................................. 108124357

(51) Int. Cl.
*H01L 29/06* (2006.01)
*C01B 32/182* (2017.01)
*C23C 16/30* (2006.01)
*H01L 29/66* (2006.01)
*B82Y 30/00* (2011.01)

(52) U.S. Cl.
CPC ............ *C01B 32/182* (2017.08); *C23C 16/30* (2013.01); *H01L 29/66* (2013.01); *H01L 29/66969* (2013.01); *B82Y 30/00* (2013.01)

(58) Field of Classification Search
CPC ..... H01L 29/66; H01L 29/66969; B81B 7/02; C01B 32/182; C23C 16/30
USPC ........................................................ 257/29
See application file for complete search history.

(56) References Cited

U.S. PATENT DOCUMENTS

2012/0308884 A1  12/2012  Oguni et al.
2014/0242343 A1   8/2014  Free et al.

FOREIGN PATENT DOCUMENTS

CN     101423209 A      5/2009
CN     108975266 A  *  12/2018
(Continued)

OTHER PUBLICATIONS

Taiwan Office Action and Search Report, dated Feb. 18, 2020, in counterpart Taiwan patent application 108124357, 9 pages in Chinese and 1-page English summary.
(Continued)

*Primary Examiner* — Brook Kebede
(74) *Attorney, Agent, or Firm* — Juan Carlos A. Marquez; Marquez IP Law Office PLLC

(57) ABSTRACT

The present invention relates to a device comprising physical properties controlled by a microstructure and a method of manufacturing the same. The present invention discloses a base layer having a patterned surface; and a two-dimensional structure layer formed on the patterned surface of the base layer, the two-dimensional structure layer extending on and in compliance to topography of the patterned surface of the base layer, such that change of physical properties of the two-dimensional structure layer conforms to the stress generated along the topography.

15 Claims, 22 Drawing Sheets

(56) References Cited

FOREIGN PATENT DOCUMENTS

TW        201446524 A    12/2014
TW          I582041 B     5/2017

OTHER PUBLICATIONS

"Strain tolerance of two-dimensional crystal growth on curved surfaces," Wang et al., Science Advances 2019:5, May 31, 2019, pp. 1-10.

Taiwan Office Action and Search Report, dated Jul. 27, 2020, in counterpart Taiwan patent application 108124357, 5 pages in Chinese and 1-page English summary.

\* cited by examiner

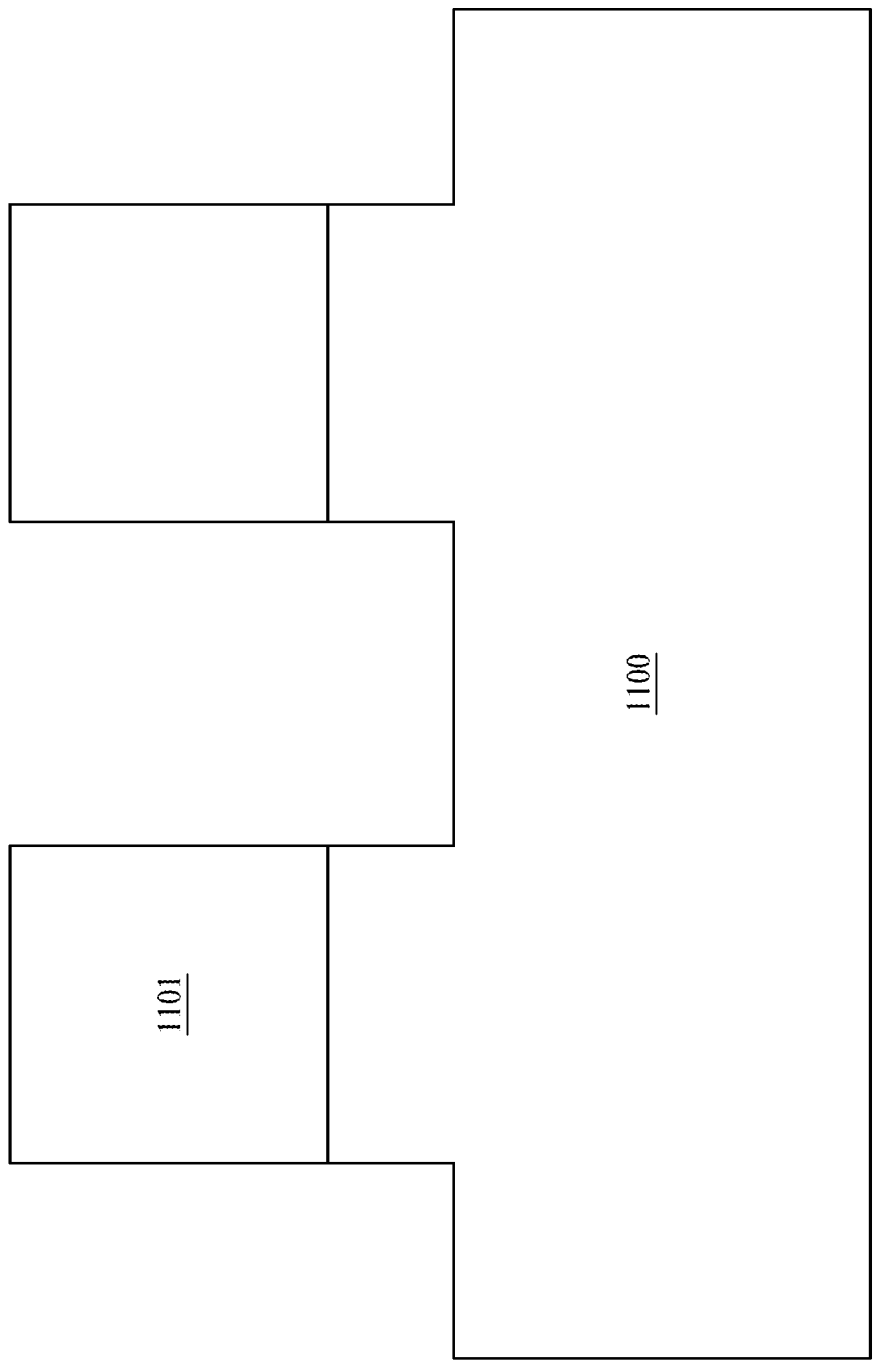

US 11,358,868 B2

DEVICE COMPRISING PHYSICAL PROPERTIES CONTROLLED BY MICROSTRUCTURE AND METHOD OF MANUFACTURING THE SAME

BACKGROUND OF THE INVENTION

1. Field of the Invention

The present invention relates to a device comprising a two-dimensional structure material and a method of manufacturing the same.

2. Description of the Related Art

A two-dimensional material refers to a material having a two-dimensional lattice arrangement with a single or few atom-thick layers, and thereof can be separated by a physical or chemical method and wherein the single layer is composed of a single element or mixed elements of staggered arrangements.

It is known that when the lattice arrangement of a two-dimensional material is subjected to compressive stress or tensile stress, atomic spacing thereof changes. The change in atomic spacing leads to the change of energy band structure, and consequently gives rise to other physical properties, including an electric conductivity, a magnetic connectivity, an optical refractive index, a light transmittance and/or a thermal conductivity.

SUMMARY OF THE INVENTION

One embodiment of the present invention provides a device comprising physical properties controlled by a microstructure, which comprises a base layer having a patterned surface and a two-dimensional structure layer formed on the patterned surface of the base layer, the two-dimensional structure layer extending on and in compliance with surface topography of the base layer. Wherein the two-dimensional structure layer includes a two-dimensional material having two-dimensional lattice arrangement with a single or few atom-thick layers, and the change of the physical properties of the two-dimensional structure layer depends on topography-induced stress.

Another embodiment of the present invention provides a method of forming a device comprising physical properties controlled by a microstructure, which comprises the steps of: patterning a surface of a base layer; and forming a two-dimensional structure layer on the patterned surface of the base layer, the two-dimensional structure layer extending on and in compliance with the topography of the patterned surface of the base layer, the two-dimensional structure layer includes a two-dimensional material having two-dimensional lattice arrangement with a single or few atom-thick layers, such that the change of physical properties of the two-dimensional structure layer depends on topography-induced stress.

BRIEF DESCRIPTION OF THE DRAWINGS

Exemplary embodiments will be described herein according to the accompanying drawings in which:

FIG. 11a to FIG. 11g show a flow chart of a method of the device comprising physical properties controlled by the microstructure according to the present invention.

PREFERRED EMBODIMENT OF THE PRESENT INVENTION

Figure 1:
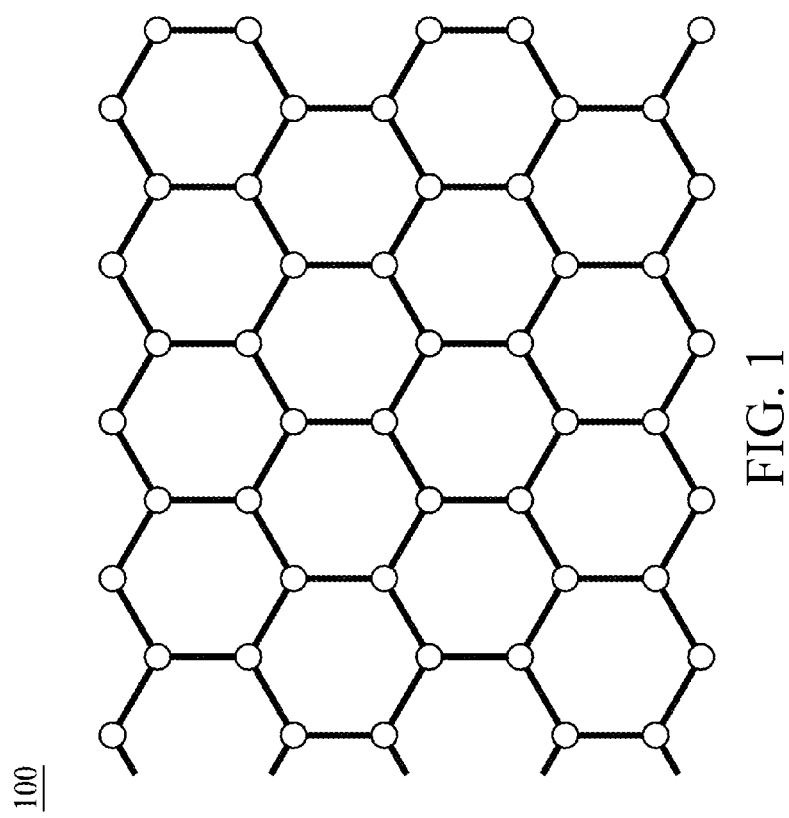
FIG. 1 is a single-layer two-dimensional material.

FIG. 1 is a schematic arrangement view of a single-layer two-dimensional material 100. The single-layer two-dimensional material 100 is a plane formed of hexagonal lattices. The single-layer two-dimensional material 100 includes the same kind of atoms and is only one atom thick.

The single-layer two-dimensional material 100 can be, for example, graphene. Graphene is a thin film consisting of carbon atoms with the hexagonal lattice and is only one carbon atom thick. Single-layer graphene is one of the thinnest nanomaterials in the world at present, which is almost transparent, a thermal conductivity coefficient of 5300 W/m·K. Single-layer graphene has the smallest electrical resistivity at room temperature and has excellent flexibility. Due to an ultralow electrical resistivity and an ultrahigh electron moving speed, single-layer graphene is a promising material potential for future electronic devices with thinner thickness and higher conductivity. Another characteristic of single-layer graphene is the quantum hall effect at normal temperature.

Additionally, the two-dimensional structure material with the lattice arrangement shown in FIG. 1 also includes silicene and germanene.

Figure 2:
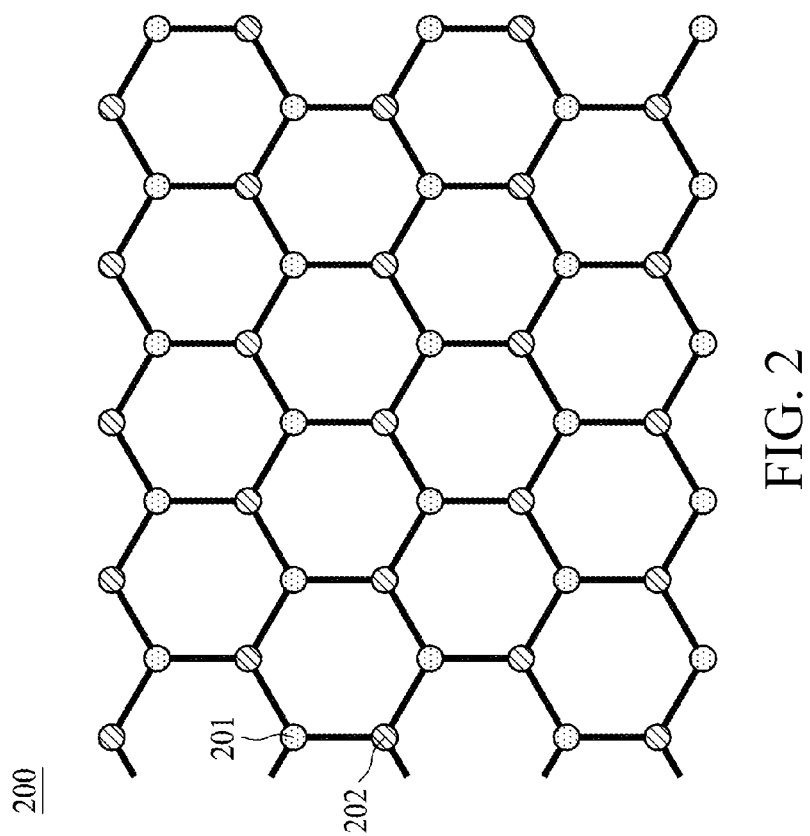
FIG. 2 is a single-layer two-dimensional material arranged with two different atoms.

FIG. 2 is a schematic view of another single-layer two-dimensional material 200. The single-layer two-dimensional material 200 is a plane formed of hexagonal lattices. The single-layer two-dimensional material 200 is only one atom thick. The single-layer two-dimensional material 200 includes two different atoms, i.e., atoms 201 and atoms 202.

The single-layer two-dimensional material 200 may include molybdenum disulfide wherein atoms 201 and atoms 202 are molybdenum atoms and sulphur atoms, respectively. Additionally, the single-layer two-dimensional material 200 can be other transition metal disulfides, such as $MoSe_2$.

The two-dimensional structure layer is not limited to a lattice arrangement of hexagonal; it may include a lattice arrangement of other polygonal patterns, for example, black phosphorus is one of the two-dimensional material with lattice arrangement.

A two-dimensional material layer can be formed on a base layer. Due to the textures and patterns of the base layer per se, deformation of the two-dimensional material layer induces strain at the bends of the topography, thereby changing the physical properties of the two-dimensional material layer.

Figure 3:
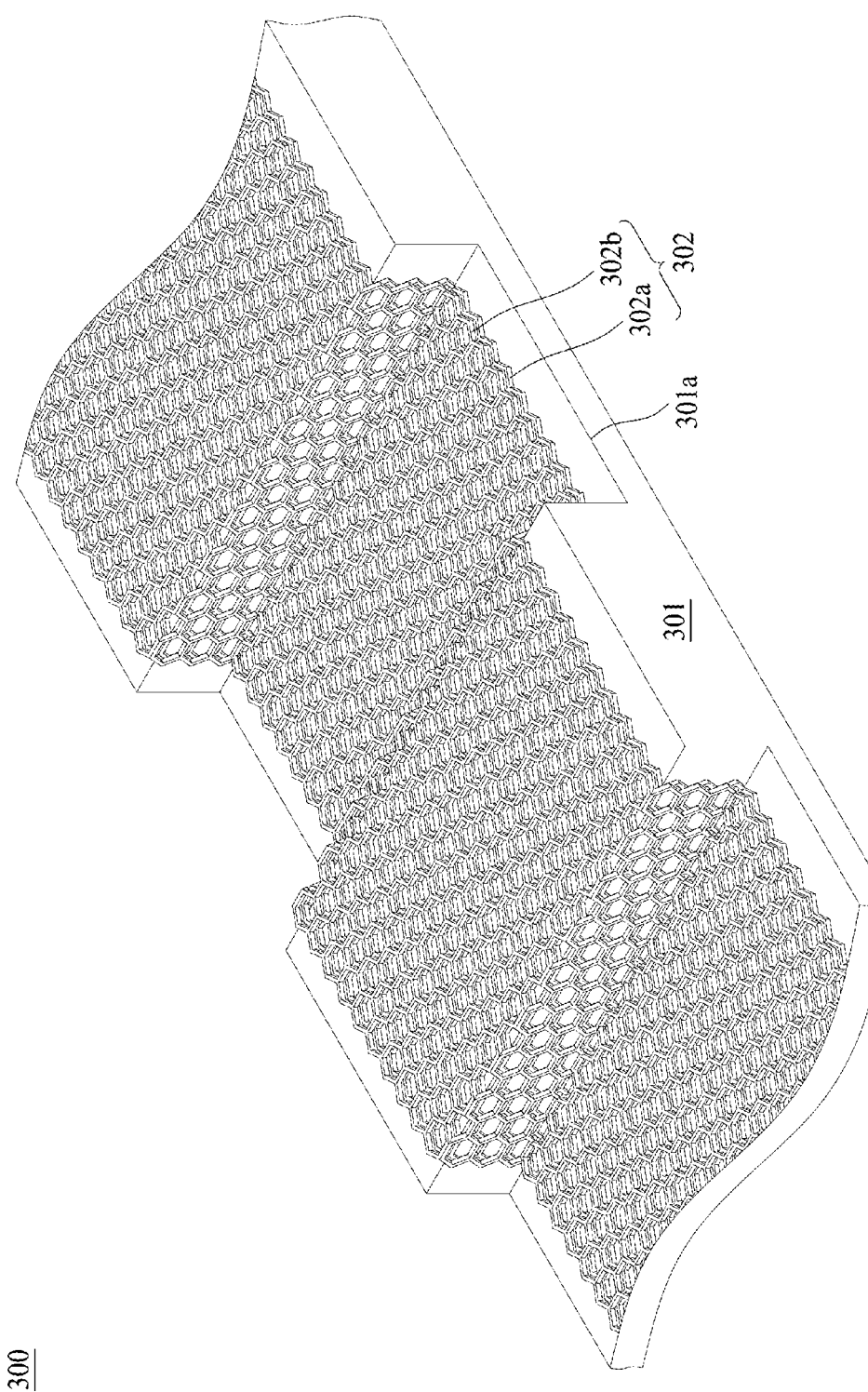
FIG. 3 is a device comprising physical properties controlled by a microstructure according to the present invention.

FIG. 3 is a device 300 comprising physical properties controlled by a microstructure according to the present invention, including a base layer 301 and a two-dimensional structure layer 302.

The base layer 301 can be formed by an insulating material such as silicon dioxide, hexagonal boron nitride, aluminum oxide, glass, ceramic materials and insulating polymeric materials. The base layer 301 has a patterned surface 301a. The patterned surface 301a can be a surface pattern of any kind, such as regular/irregular patterns or periodic/non-periodic patterns. In one example, the patterned surface 301a may form periodically repeated patterns in one or more directions. In one example, the patterned surface 301a has a corrugated surface shape, that is, the patterned surface 301a has a plurality of staggered channel portions and bulge portions.

The two-dimensional structure layer can include two-dimensional lattice arrangement formed by single-layer atoms or molecules. In other embodiments, the two-dimensional structure layer 302 can be formed by a first layer 302a and a second layer 302b, the two-dimensional structure layer 302 is formed in compliance with the patterned surface 301a, and the two-dimensional structure layer 302 extends on the patterned surface 301a. FIG. 2 shows the embodiment of the atoms or molecules of a two-layer two-dimensional material. Note that the present invention is not limited to the arrangement of two-layer atoms or molecules.

In one embodiment, the first layer 302a and the second layer 302b can be planes formed of hexagonal lattices. In other embodiments, the first layer 302a and the second layer 302b may be formed of other polygonal two-dimensional lattices. In further embodiments, the first layer 302a and the second layer 302b may be formed of lattices with the same two-dimensional patterns. Additionally, the first layer 302a and the second layer 302b may also be formed of different two-dimensional pattern lattices.

In one embodiment, the first layer 302a and the second layer 302b may include one kind of atoms. In further embodiments, the first layer 302a and the second layer 302b may include different kinds of atoms.

Returning to FIG. 3, the two-dimensional structure layer 302 extends on and is in compliance with the topography of the patterned surface 301a of the base layer 301a. In one embodiment, the patterned surface 301a of the base layer 301 has a corrugated surface shape, and the two-dimensional structure layer 302 formed on the patterned surface 301a has the corrugated topography adaptively. In other words, the two-dimensional structure layer 302 conforms to the patterned surface 301a.

The two-dimensional structure layer 302 has an adaptive transition at the bends of the patterned surface 301a, and the atomic spacing is thereby changed. The change of atomic spacing may cause lattice deformation at the bends. For instance, the increasing of the lattice spacing causes a tensile stress while decreasing of the lattice spacing causes compressive stress. Further, the lattice deformation leads to the change in energy gap and energy band, and consequently influences other physical properties, including an electric conductivity, a magnetic flux property, an optical refractive index, a light transmittance and a thermal conductivity.

The amount of change and form of the change of the physical properties of the two-dimensional material layer conform to the lattice deformation. The stronger the stress received by the two-dimensional material layer, the greater the deformation of the lattices, and the amount of the change of the physical properties can be influenced accordingly, which may change according to particular relations. In one example, a pseudo-magnetic field generated by the stress increases with the amount of deformation.

FIG. 3 only shows the two-dimensional structure layer 302 including the first layer 302 and the second layer 302b. According to this embodiment of the present invention, the two-dimensional structure layer 302 may include one or more single layers, wherein each layer is only one atom or molecule thick. According to one embodiment of the present invention, the two-dimensional structure layer 302 includes 1 to 40 layers. In one embodiment, the two-dimensional structure layer 302 is not thicker than 30 atom or molecule layers. In one preferred embodiment, the two-dimensional structure layer 302 is not thicker than 10 atom or molecule layers. In one preferred embodiment, the two-dimensional structure layer 302 is not thicker than 5 atom or molecule layers.

Returning to FIG. 3, the two-dimensional structure layer 302 has the topography corresponding to the patterned surface 301a. Therefore, the amount of lattice deformation generated in the topography conforms to the thickness. The greater the thickness, the greater the deformation for individual layers leaving away from the patterned surface 301a in the bends generated by the two-dimensional structure layer 302, and the physical properties change correspondingly.

The two-dimensional structure layer 302 behaves flat and undulating topography simultaneously, causing inhomogeneous or nonuniform stress distribution, and further causing inhomogeneous change/variation of physical properties of the two-dimensional structure layer 302, including the inhomogeneous variation of optical properties, electrical properties and magnetic properties. For example, inhomogeneous variation of physical property due to topography of the two-dimensional structure layer 302 can be used to control an electron motion path and for the current path. Similarly, a pseudo magnetic flux path may be controlled by the topography, and the pseudo-magnetic field may be controlled further.

Figure 4:
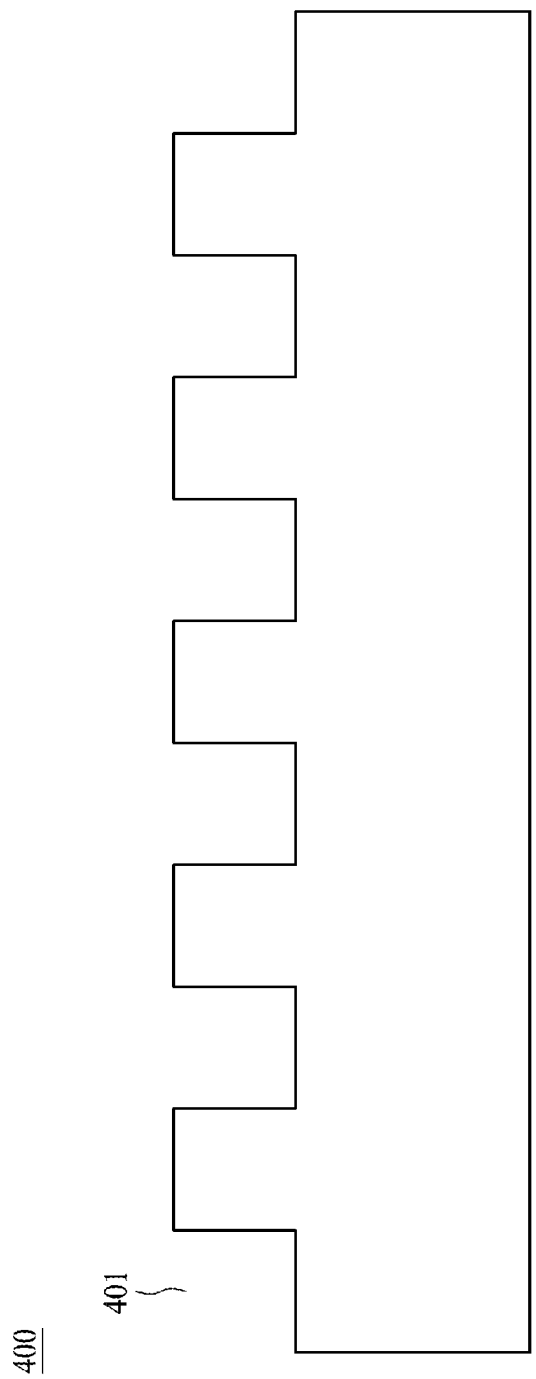
FIG. 4 to FIG. 10 (including FIG. 10a and FIG. 10b) show base layers having different patterned surfaces.
Figure 5:
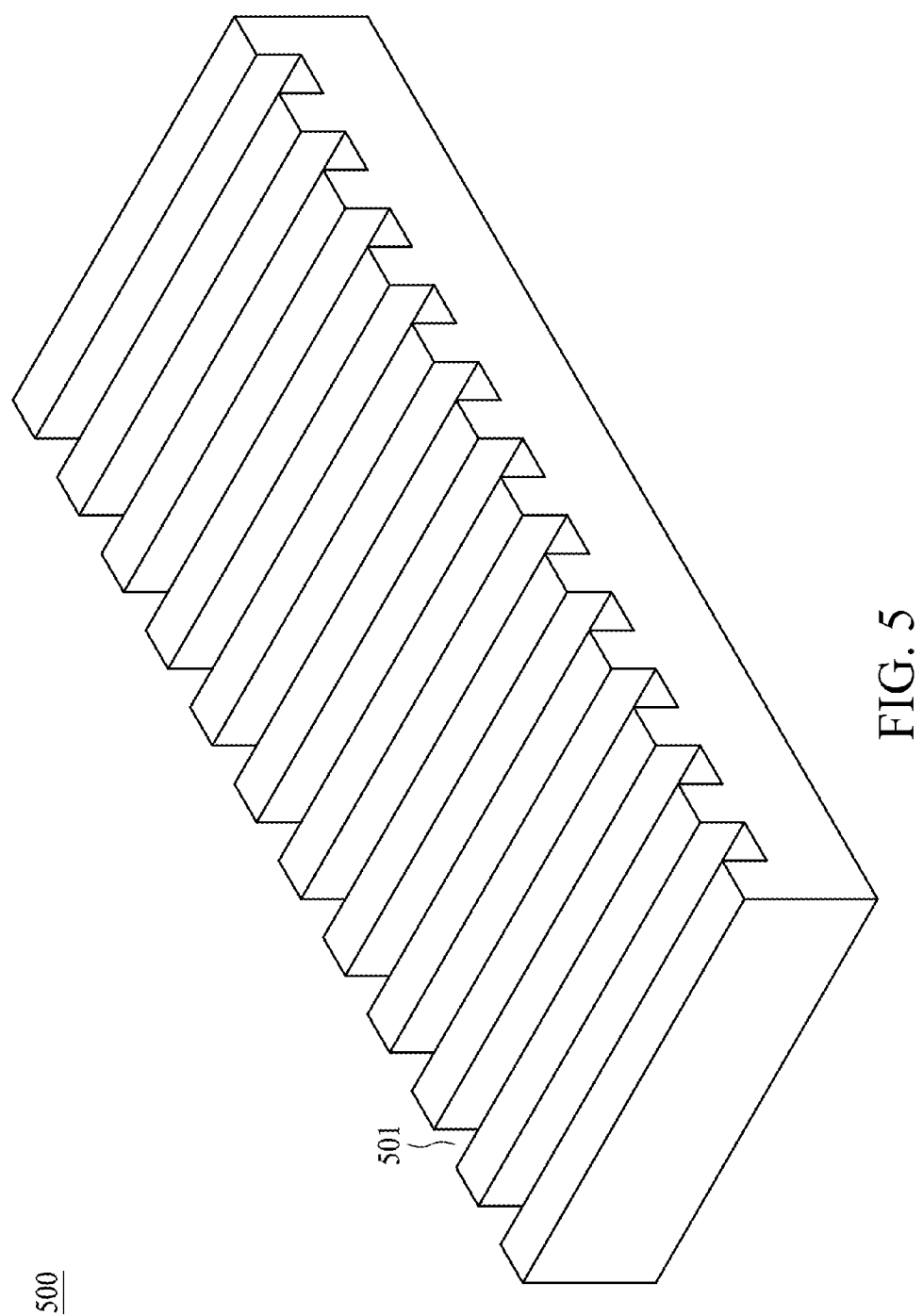
Figure 6:
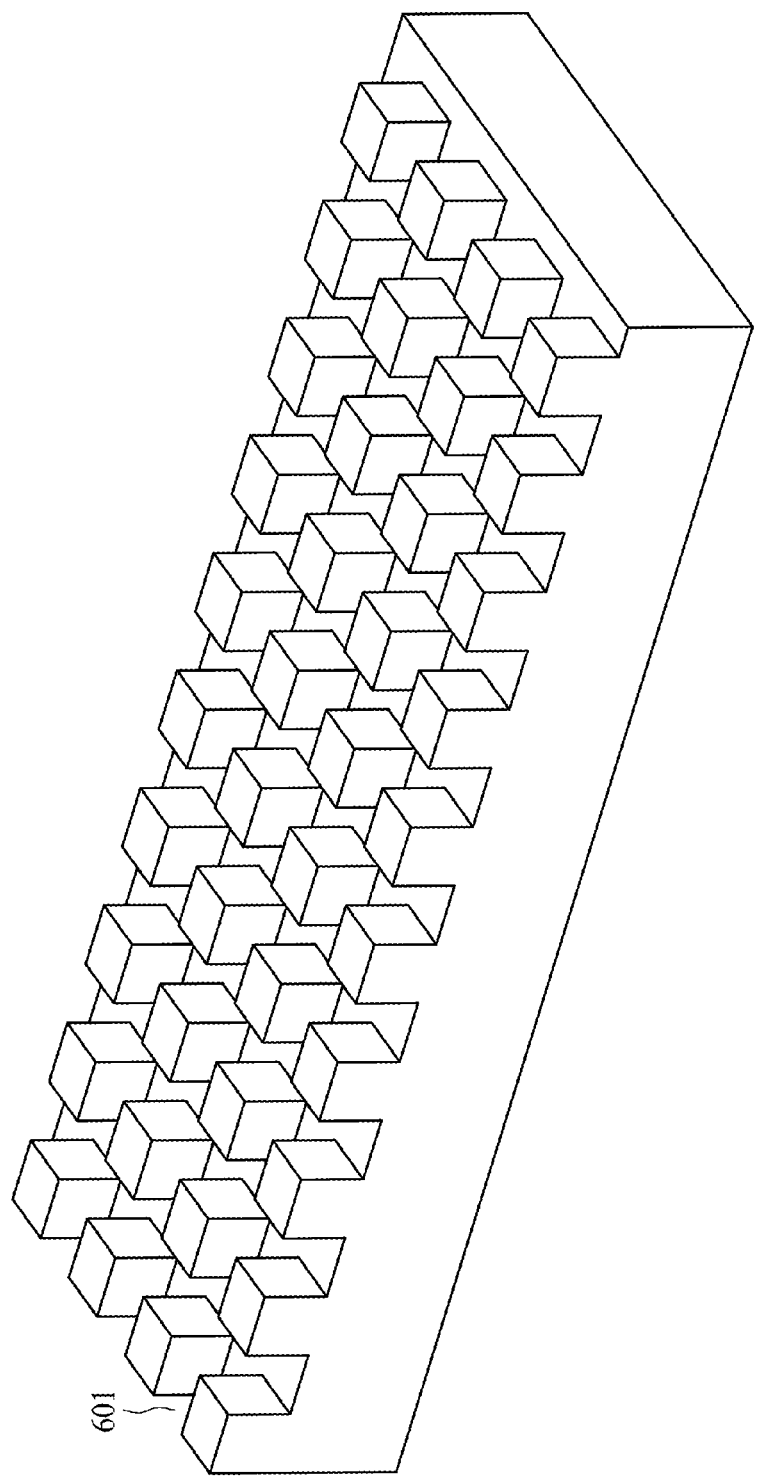
Figure 7:
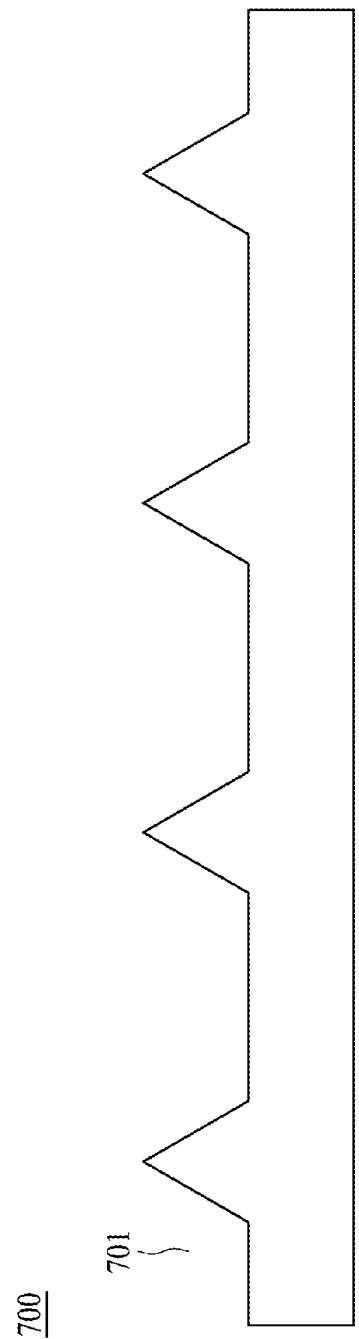
Figure 8:
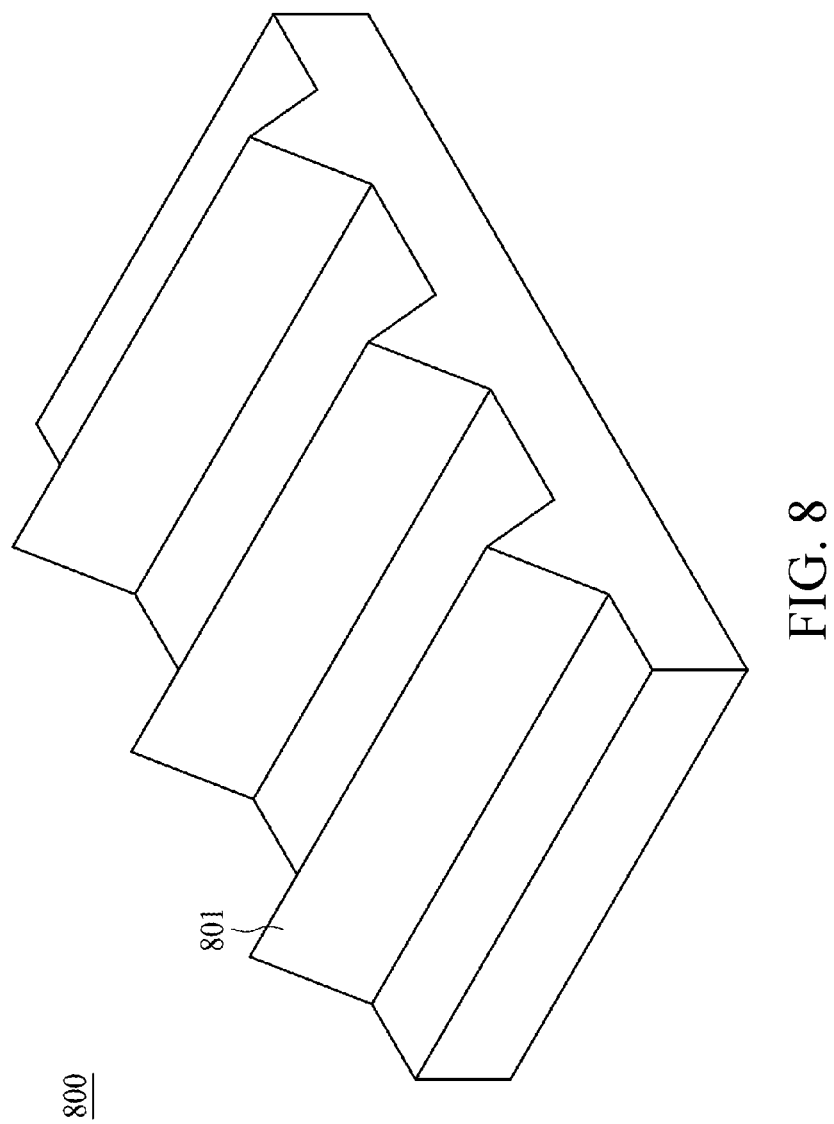
Figure 9:
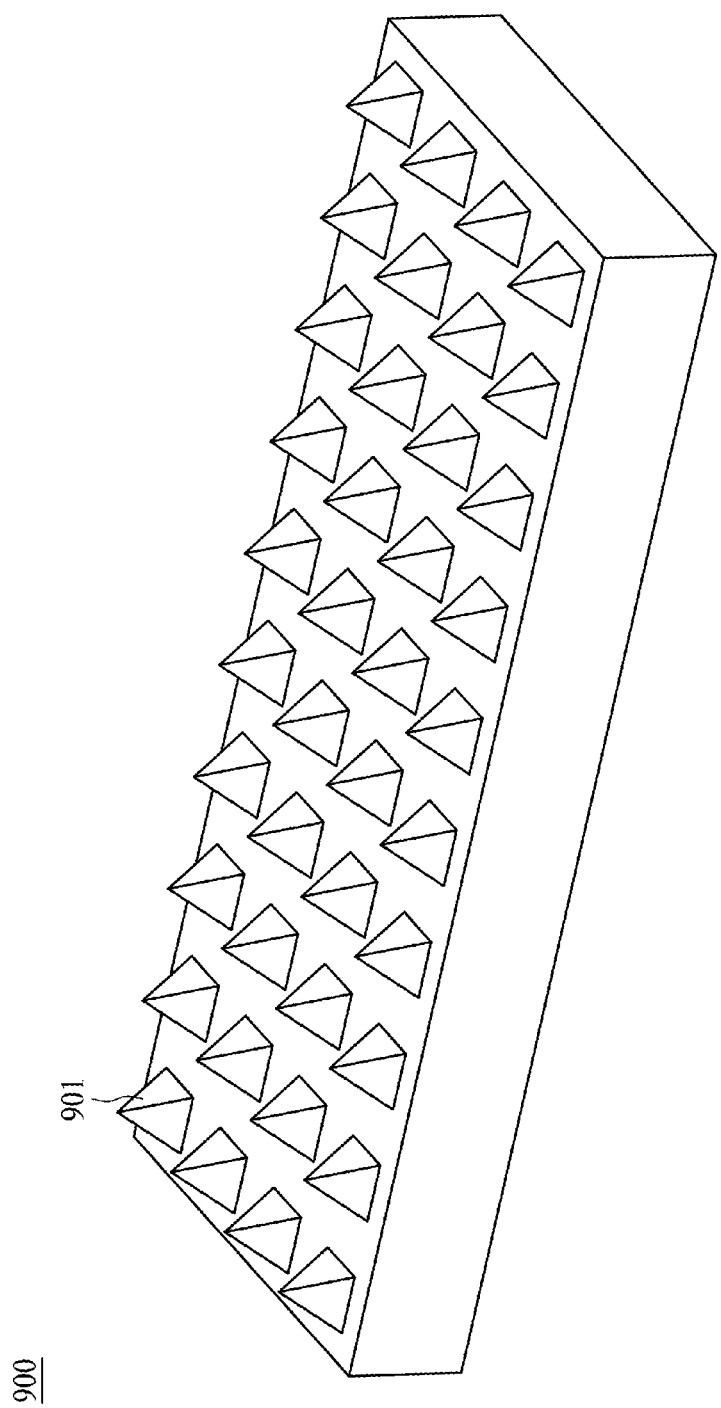
Figure 10A:
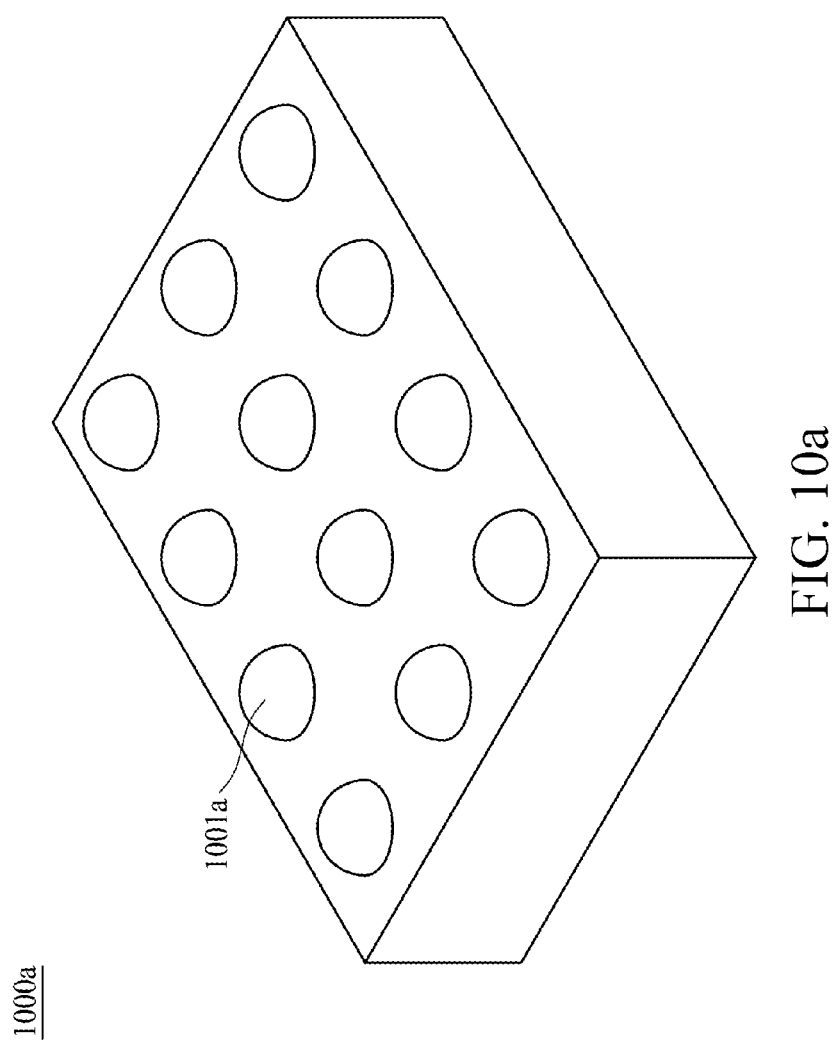
Figure 10B:
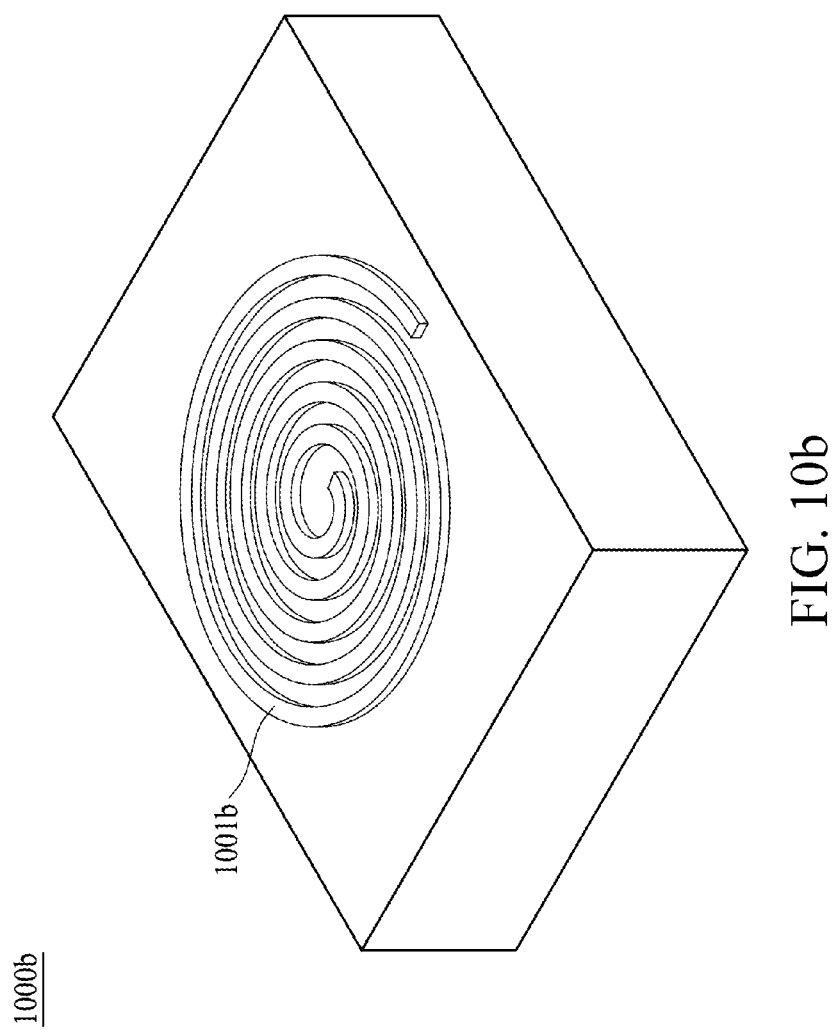

FIG. 4 to FIG. 10 (including FIG. 10a and FIG. 10b) show different implementation states of the patterned surface of the base layer. In FIG. 4, a base layer 400 has a patterned surface 401 with a cross section similar to square waves. In FIG. 5, a base layer 500 has a patterned surface 501 comprising a plurality of staggered channel portions and bulge portions. In FIG. 6, a base layer 600 has a patterned surface 601 shown by a cube matrix. In FIG. 7, a base layer 700 has a patterned surface 701 having a cross section similar to triangular waves. In FIG. 8, a base layer 800 has a patterned surface 801 comprising a plurality of staggered channel portions and triangular strip-shaped portions. In FIG. 9, a base layer 900 has a patterned surface 901 shown by a triangular pyramid matrix. In FIG. 10a, a base layer 1000a has a patterned surface 1001a shown by a hemisphere matrix. In FIG. 10b, a base layer 1000b has a patterned surface 1001b shown in a spiral shape.

An active layer conforming to the patterned surface can be provided on the base layer having different patterned surfaces shown in FIG. 4 to FIG. 10, thereby regulating or changing the material properties in the active layer.

Figure 11A:
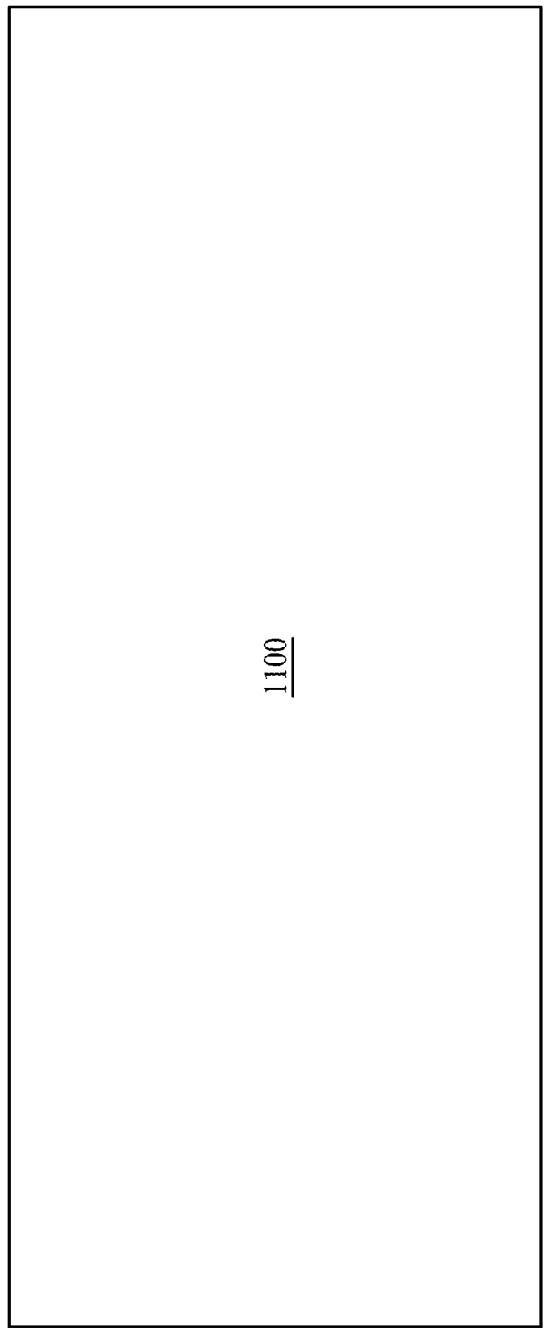
Figure 11B:
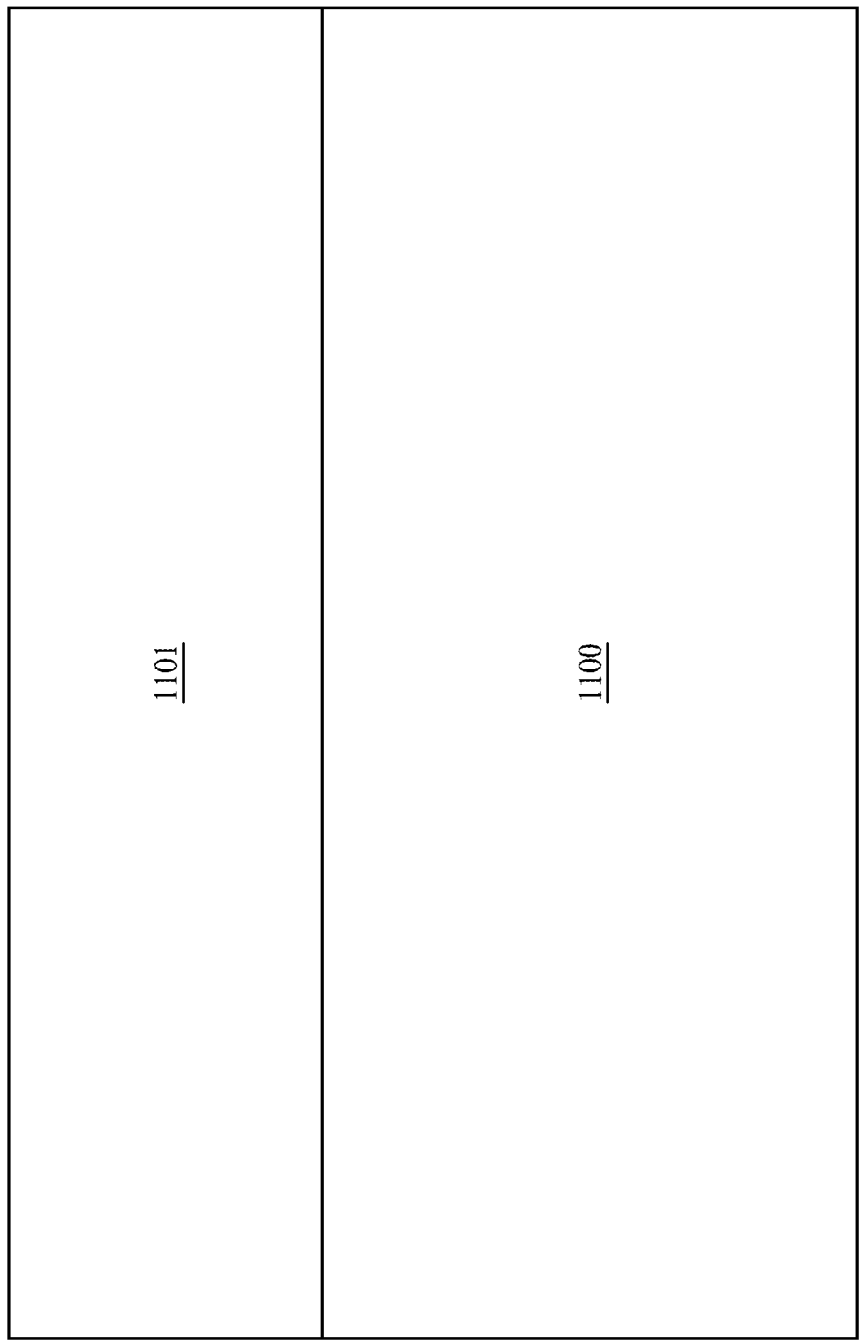
Figure 11C:
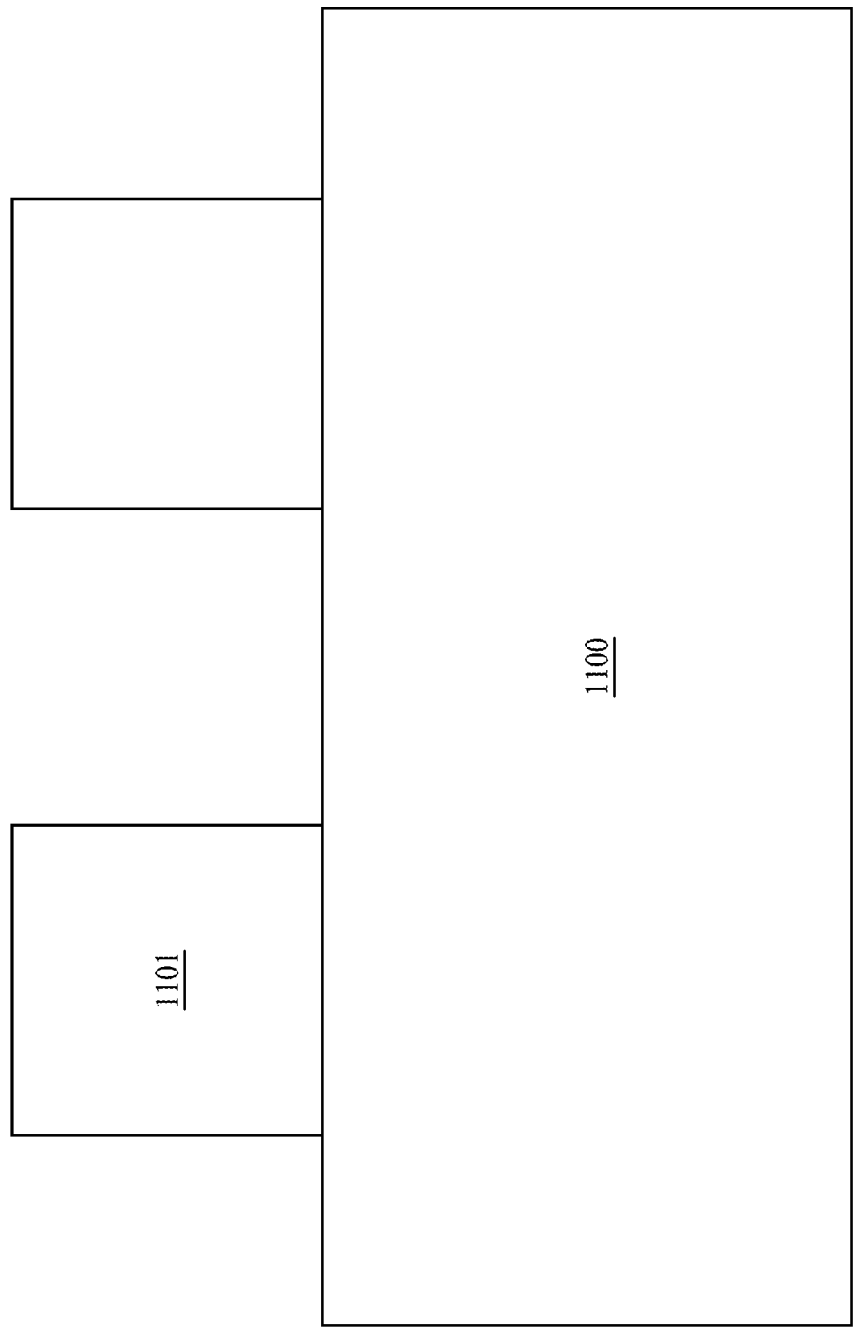
Figure 11E:
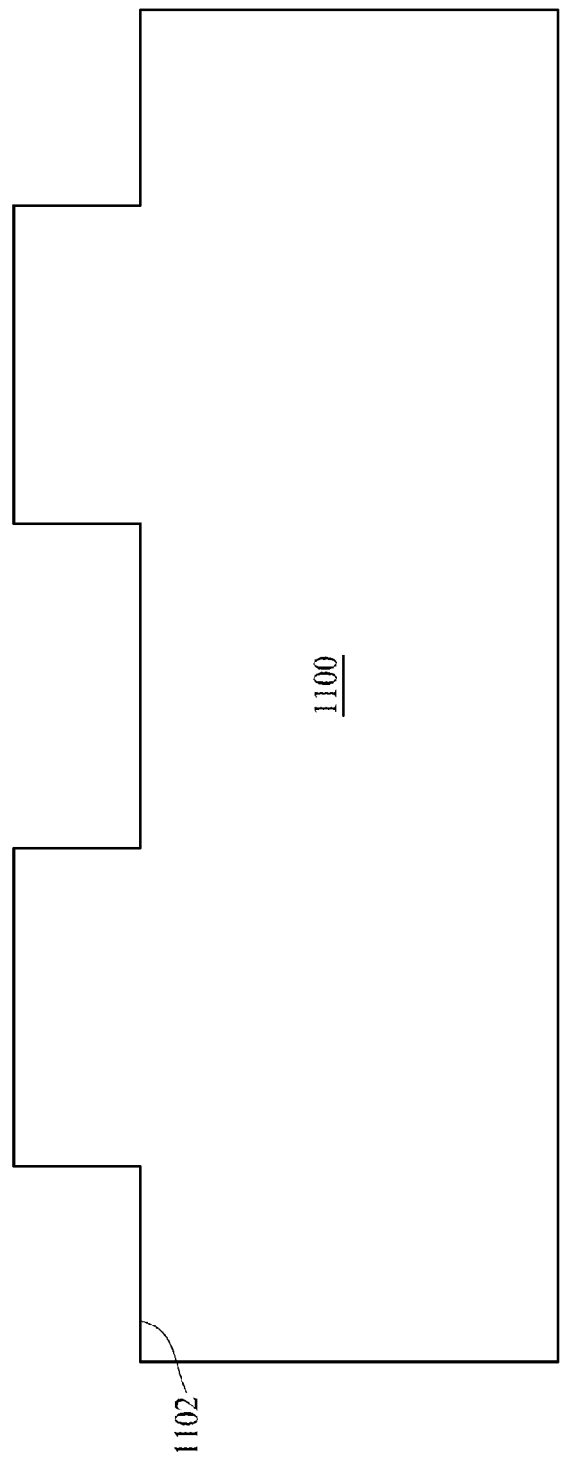
Figure 11F:
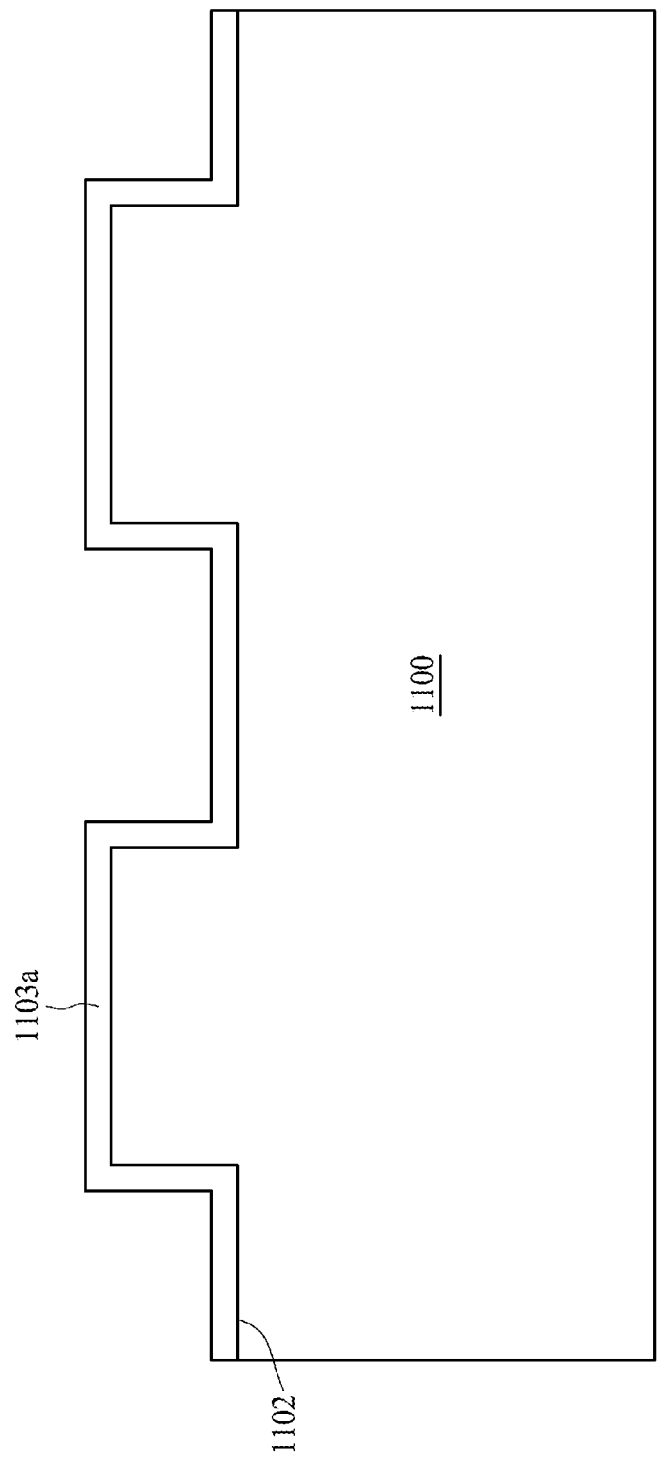
Figure 11G:
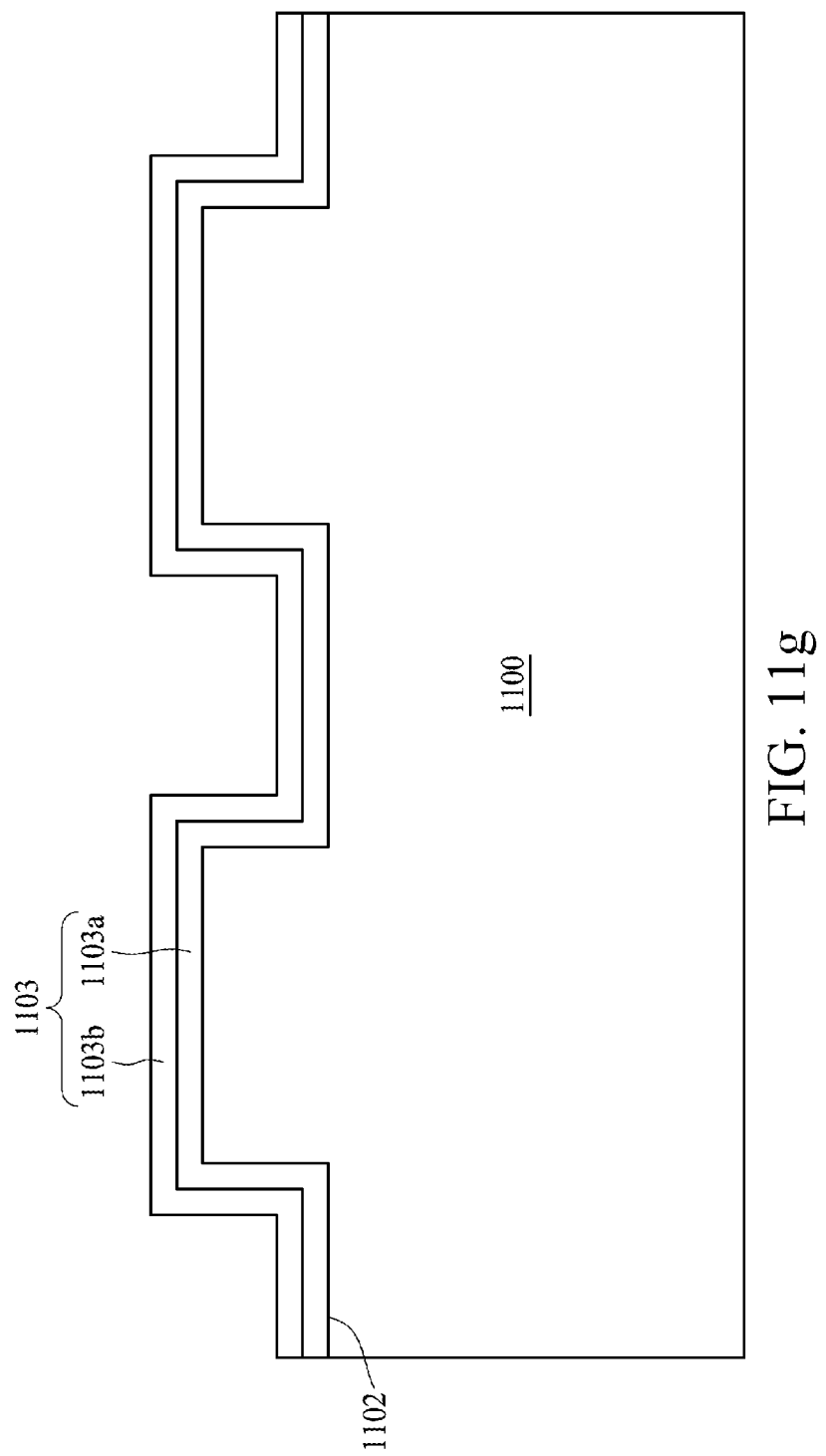

FIG. 11a to FIG. 11g show the flow process of the device comprising physical properties controlled by the microstructure formed according to the present invention. In FIG. 11a, a base layer 1100 is provided. In FIG. 11b, a photoresist layer 1101 coats a surface of the base layer 1100. In FIG. 11c, a photomask having a predefined pattern is used for exposing and developing the photoresist layer 1101. In FIG. 11d, the base layer 1100 is etched by an etching technology so as to form the patterned surface on the base layer 1100. In FIG. 11e, the photoresist layer 1101 is removed so as to expose the patterned surface 1102. In FIG. 11f, a first layer 1103a is provided on the patterned surface 1102 of the base layer 1100. In FIG. 11g, a second layer 1103b is provided on the first layer 1103a so as to form a two-dimensional structure layer 1103.

Besides the photolithography technology mentioned above, patterning the surface of the base layer can be conducted by one of the following technologies including an EBL (e-beam lithography) technology, an ion-beam lithography technology and a self-assembly technology.

Figure 12A:
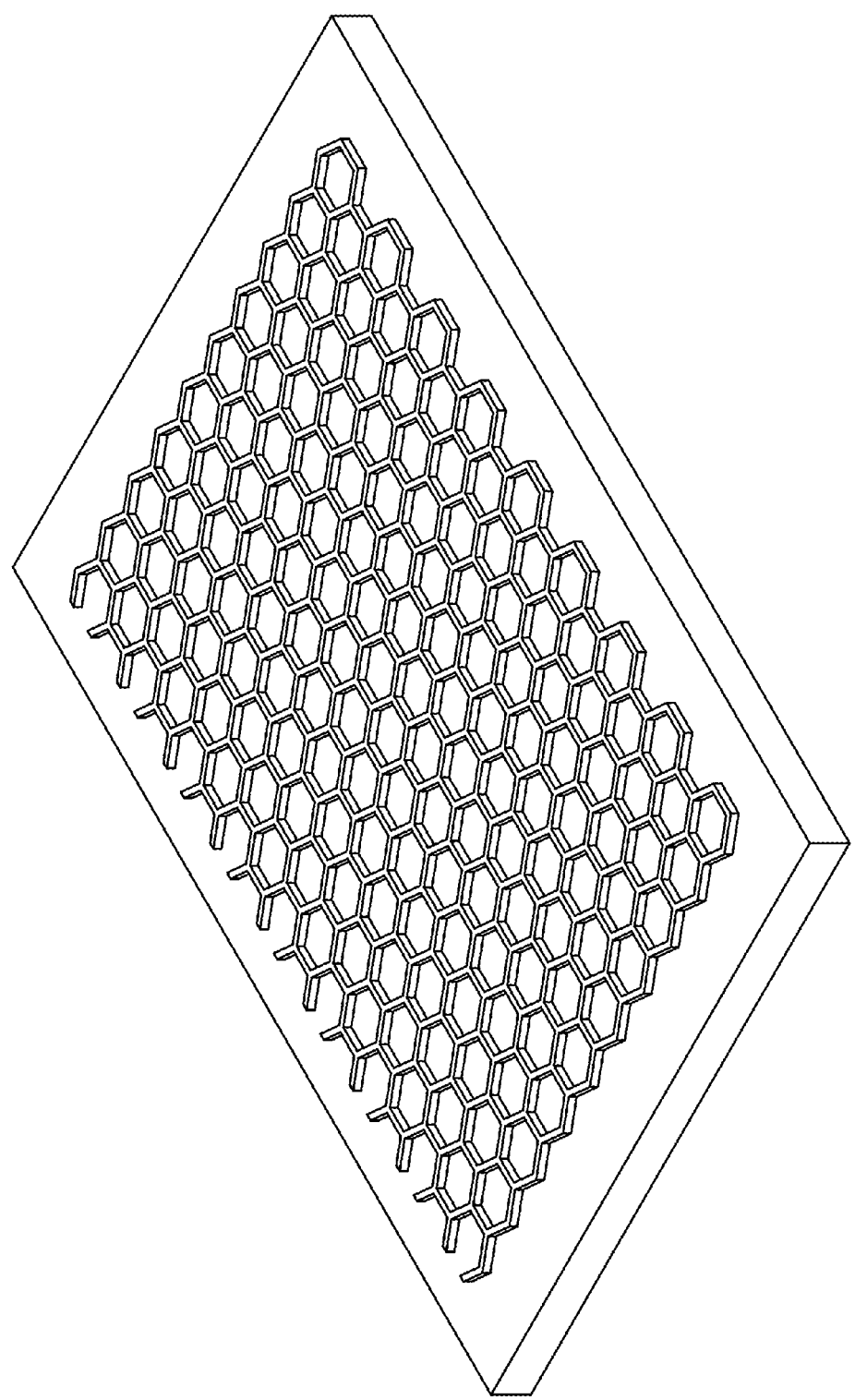
FIG. 12a to FIG. 12d show a flow chart of a method of providing a two-dimensional material layer onto a patterned surface of a base layer according to the present invention.
Figure 12B:
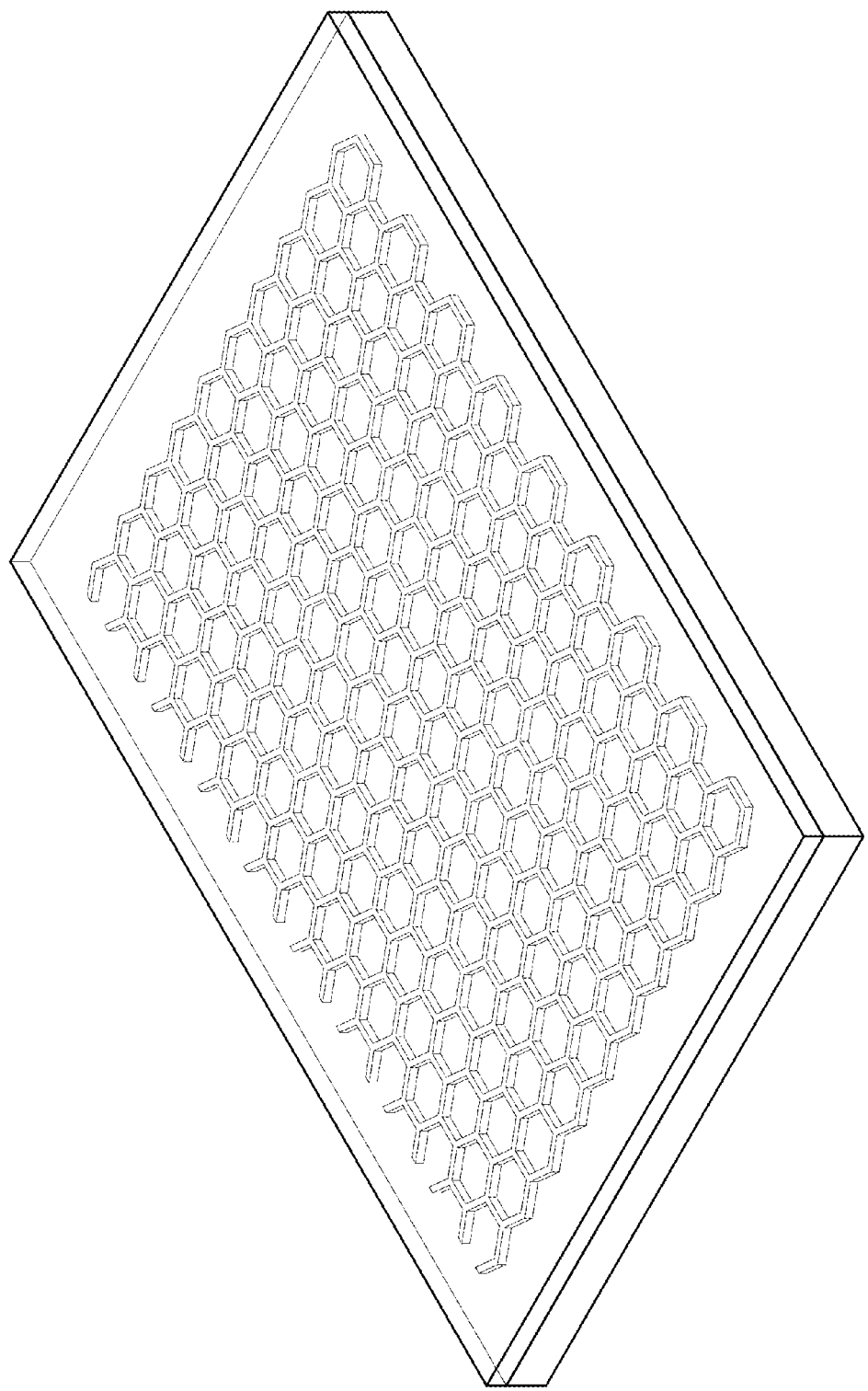
Figure 12C:
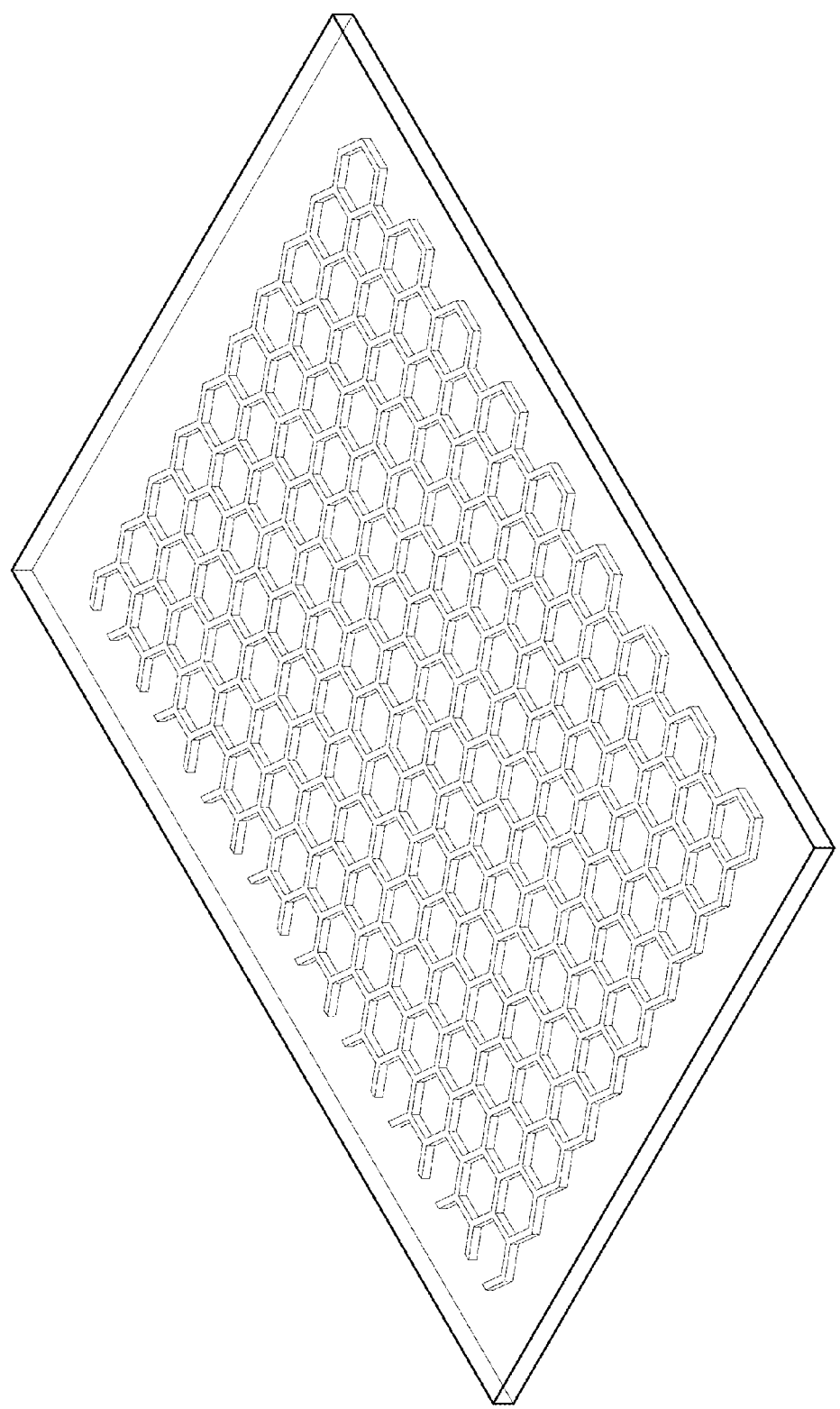
Figure 12D:
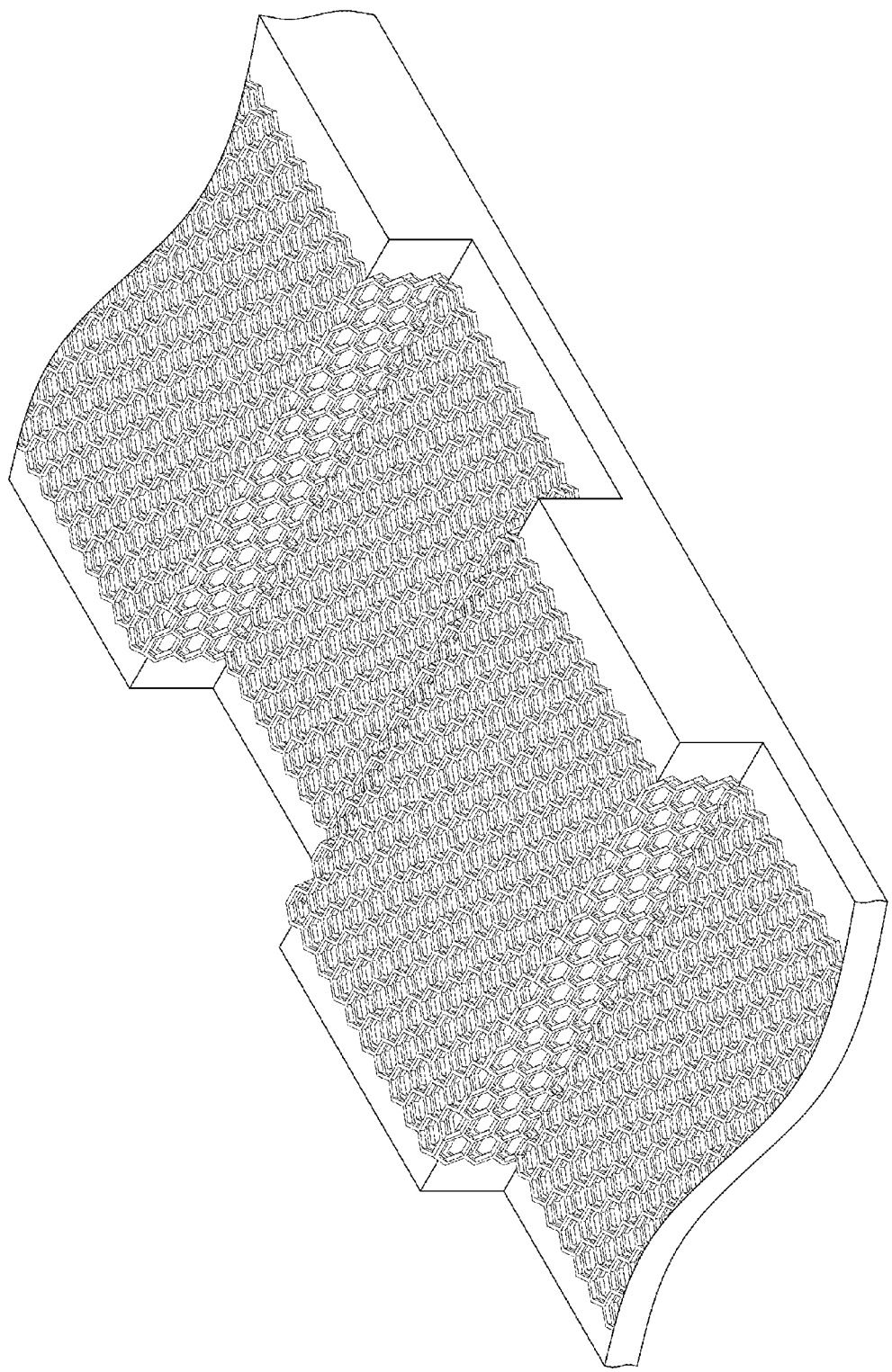

FIG. 12a to FIG. 12d show a flow chart of a method for providing the two-dimensional material layer onto the patterned surface of the base layer according to the present invention. In FIG. 12a, the two-dimensional material layer grows on a copper clad laminate by a CVD (Chemical Vapor Deposition) method. In FIG. 12b, a polymer layer is provided on the two-dimensional material layer. In FIG. 12c, the copper clad laminate is removed. In FIG. 12d, the two-dimensional material layer is transferred onto the patterned surface of the base layer so that the two-dimensional material layer has the topography practically corresponding to the patterned surface, and the above-mentioned steps are repeated so as to form a multilayer two-dimensional material layer, wherein the transfer step can be a dry transfer step.

Additionally, forming the two-dimensional material layer can be conducted by technologies such as an atomic layer deposition method, an electrochemical stripping method, a mechanical stripping method and an oxidation reduction method.

Other embodiments may be devised by persons skilled in the art without departing from the scope of the following claims.

SYMBOL DESCRIPTION 100 single-layer two-dimensional material
200 single-layer two-dimensional material
201 atom
202 atom
300 device comprising physical properties controlled by a microstructure
301 base layer
301a patterned surface
302 two-dimensional structure layer
302a first layer
302b second layer
400 base layer
401 patterned surface
500 base layer
501 patterned surface
600 base layer
601 patterned surface
700 base layer
701 patterned surface
800 base layer
801 patterned surface
900 base layer
901 patterned surface
1000a base layer
1001a patterned surface
1000b base layer
1001b patterned surface
1100 base layer
1101 photoresist layer
1102 patterned surface
1103 two-dimensional structure layer
1103a first layer
1103b second layer

What is claimed is:

1. A device comprising physical properties controlled by a microstructure, comprising:
a base layer having a patterned surface; and
a two-dimensional structure layer formed on the patterned surface of the base layer, the two-dimensional structure layer extending on and in compliance with topography of the patterned surface of the base layer,
wherein the two-dimensional structure layer comprises a two-dimensional material having a lattice arrangement of a two-dimensional pattern, and the change of the physical properties of the two-dimensional structure layer conforms to stress generated along the topography.

2. The device comprising physical properties controlled by a microstructure according to claim 1, wherein the two-dimensional structure layer comprises one or more single-layer two-dimensional materials.

3. The device comprising physical properties controlled by a microstructure according to claim 2, wherein the two-dimensional structure layer comprises 1 to 30 layers.

4. The device comprising physical properties controlled by a microstructure according to claim 2, wherein the two-dimensional structure layer comprises 1 to 5 layers.

5. The device comprising physical properties controlled by a microstructure according to claim 2, wherein the two-dimensional material comprises at least one of the group consisting of graphene, transition metal disulfide, silicene and germanene.

6. The device comprising physical properties controlled by a microstructure according to claim 1, wherein the stress leads to localized lattice deformation of the two-dimensional structure layer.

7. The device comprising physical properties controlled by a microstructure according to claim 6, wherein the change of physical properties of the two-dimensional structure layer conforms to the lattice deformation.

8. The device comprising physical properties controlled by a microstructure according to claim 1, wherein the physical properties of the two-dimensional structure layer comprise at least one of: an energy gap, an electric conductivity, a magnetic flux property, an optical refractive index, a light transmittance and a thermal conductivity.

9. The device comprising physical properties controlled by a microstructure according to claim 1, wherein the topography of the two-dimensional structure layer comprises a periodic topography pattern.

10. The device comprising physical properties controlled by a microstructure according to claim 1, wherein the topography of the two-dimensional structure layer comprises a corrugated topography pattern.

11. The device comprising physical properties controlled by a microstructure according to claim 1, wherein the topography of the two-dimensional structure layer comprises a triangular wave topography pattern.

12. The device comprising physical properties controlled by a microstructure according to claim 1, wherein the physical properties comprise an electric conductivity, and at least partial current path in the device comprising physical properties controlled by the microstructure conforms to the topography of the patterned surface of the base layer.

13. A method of forming a device comprising physical properties controlled by a microstructure, comprising:
patterning a surface of a base layer; and
forming a two-dimensional structure layer on the patterned surface of the base layer, the two-dimensional structure layer extending on and in compliance with topography of the patterned surface of the base layer, and the two-dimensional structure layer comprising a two-dimensional material having a lattice arrangement of a two-dimensional pattern, such that the change of the physical properties of the two-dimensional structure layer conforms to stress generated along the topography.

14. The method according to claim 13, wherein patterning the surface of the base layer is conducted by at least one of: a photolithography technology, an e-beam lithography technology and a self-assembly technology.

15. The method according to claim 13, wherein forming the two-dimensional structure layer on the patterned surface of the base layer is conducted by at least one of: a chemical vapor deposition, a physical vapor deposition technology, a dry transfer technology, an atomic layer deposition technology, an electrochemical stripping method, a mechanical stripping method and an oxidation reduction method.

* * * * *